(12) United States Patent
Yu et al.

(10) Patent No.: US 8,476,130 B2
(45) Date of Patent: Jul. 2, 2013

(54) SEMICONDUCTOR DEVICE AND METHOD OF FABRICATING SEMICONDUCTOR DEVICE

(75) Inventors: Tea-Kwang Yu, Hwaseong-si (KR);
Byung-Sup Shim, Yongin-si (KR);
Yong-Kyu Lee, Gwacheon-si (KR);
Bo-Young Seo, Suwon-si (KR);
Yong-Tae Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 13/180,613

(22) Filed: Jul. 12, 2011

(65) Prior Publication Data
US 2012/0070949 A1 Mar. 22, 2012

(30) Foreign Application Priority Data
Sep. 17, 2010 (KR) .......................... 10-2010-0091995

(51) Int. Cl.
*H01L 21/8238* (2006.01)
(52) U.S. Cl.
USPC ........................................................ 438/200

(58) Field of Classification Search
USPC ............................................................. 438/200
See application file for complete search history.

(56) References Cited

U.S. PATENT DOCUMENTS

| 6,444,514 B1* | 9/2002 | Nishimoto et al. | 438/221 |
| 7,834,345 B2* | 11/2010 | Bhuwalka et al. | 257/28 |
| 2002/0173091 A1* | 11/2002 | Nishimoto et al. | 438/200 |
| 2004/0213029 A1* | 10/2004 | Hirata et al. | 365/104 |
| 2011/0057162 A1* | 3/2011 | Breitwisch et al. | 257/3 |

FOREIGN PATENT DOCUMENTS

| KR | 1020070063276 A | 6/2007 |
| KR | 1020080041460 A | 5/2008 |
| KR | 100929297 B1 | 11/2009 |

* cited by examiner

*Primary Examiner* — Charles Garber
*Assistant Examiner* — Andre' C Stevenson
(74) *Attorney, Agent, or Firm* — Volentine & Whitt, PLLC

(57) ABSTRACT

A method of fabricating a semiconductor device includes providing a substrate having a memory block and a logic block defined therein, forming a dummy gate pattern on the memory block; forming a first region of a first conductivity type at one side of the dummy gate pattern and a second region of a second conductivity type at the other side of the dummy gate pattern, and forming a nonvolatile memory device electrically connected to the first region.

20 Claims, 21 Drawing Sheets

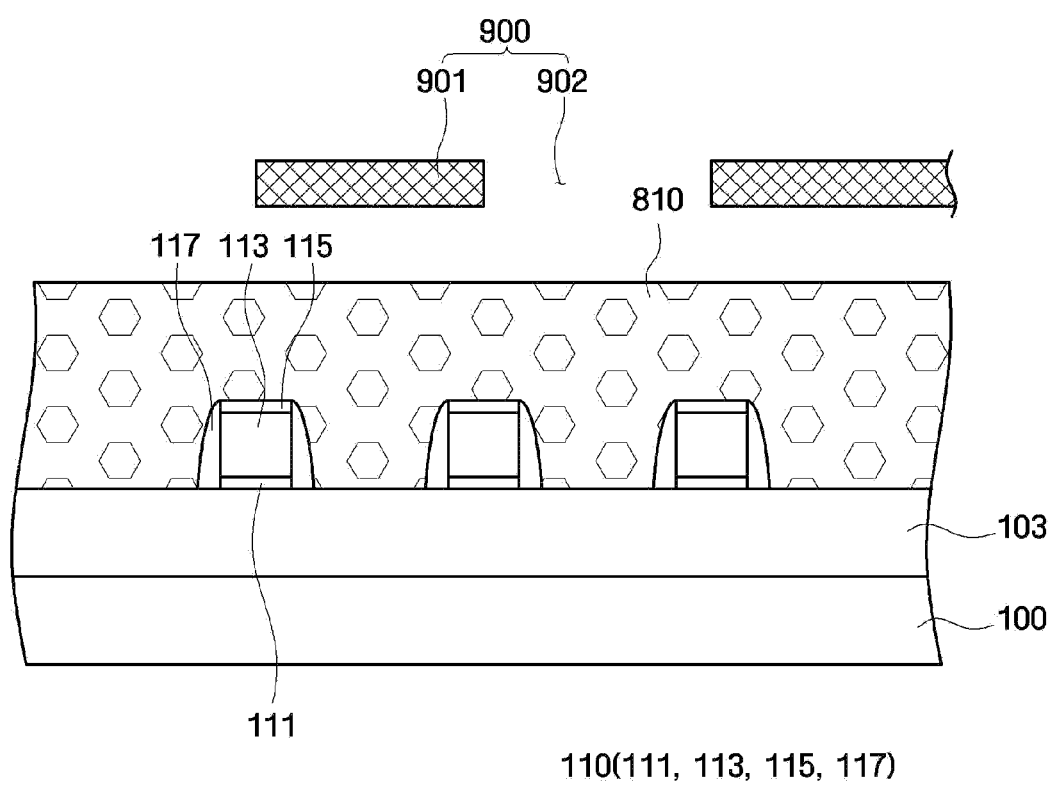

110(111, 113, 115, 117)

SEMICONDUCTOR DEVICE AND METHOD OF FABRICATING SEMICONDUCTOR DEVICE

CROSS-REFERENCE TO RELATED APPLICATION

A claim of priority, and all the benefits accruing therefrom, under 35 U.S.C. §119 is made to Korean Patent Application No. 10-2010-0091995 filed on Sep. 17, 2010, in the Korean Intellectual Property Office.

BACKGROUND

The inventive concept relates to semiconductor devices. More particularly, the inventive concept relates to a semiconductor device including a nonvolatile memory device and an access device for controlling the operation of the nonvolatile memory device, and to a method of fabricating the same.

A semiconductor memory device may be generally classified as either a volatile memory device that loses stored data when power applied thereto is interrupted or a nonvolatile memory device that retains stored data even in the absence of applied power.

A typical nonvolatile memory device is a flash memory having a stacked gate structure. Recently, though, phase change memory devices are being considered as replacements for flash memory devices. A phase change memory device can be controlled by what may be referred to as an access device. Examples of suitable access devices are diodes and bipolar junction transistors (BJTs).

SUMMARY

According to an aspect of the inventive concept, there is provided a method of fabricating a semiconductor device, comprising forming a dummy gate pattern on a memory block of a substrate, subsequently forming a first region of a first conductivity type at one side of the dummy gate pattern and a second region of a second conductivity type at the other region of the dummy gate pattern, and forming a nonvolatile memory device electrically connected to the first region.

According to another aspect of the inventive concept, there is provided a method of fabricating a semiconductor device, comprising providing a substrate having a memory block and a logic block, forming a dummy gate pattern on the memory block, subsequently forming a first region of a first conductivity type at one side of the dummy gate pattern and a second region of a second conductivity type at the other side of the dummy gate pattern, forming a first interlayer dielectric layer on the substrate as covering the dummy gate pattern, the first region and the second region, forming a first electrode in the first interlayer dielectric layer as electrically connected to the first region, forming a pattern of phase change material on and in contact with the first electrode, and forming a second electrode on the pattern of phase change material.

According to still another aspect of the inventive concept, there is provided a method of fabricating a semiconductor device, comprising forming a dummy gate pattern on a substrate wherein the dummy gate pattern has the form of a gate electrode structure of a field effect transistor (FET) and is electrically isolated from any other electrical component in the semiconductor device, subsequently forming a first region of a bipolar junction transistor (BJT) at one side of the dummy gate pattern and a second region of the BJT at the other region of the dummy gate pattern wherein the first region is of one conductivity type and the second region is of the other conductivity type, and forming a memory component electrically connected to the first region wherein the memory component comprises phase change material. Thus, the BJT controls an operation of the memory component.

BRIEF DESCRIPTION OF THE DRAWINGS

The above and other features and advantages of the inventive concept will become more apparent by referring to the detail description of preferred embodiments thereof that follows as made with reference to the attached drawings in which:

FIGS. 6B to 6H are cross-sectional views taken along the line III-III' of FIG. 6A FIGS. 7 to 10 are cross-sectional views illustrating intermediate process steps in the method of fabricating a semiconductor device according the inventive concept;

DETAILED DESCRIPTION OF THE EMBODIMENTS

Figure 1:
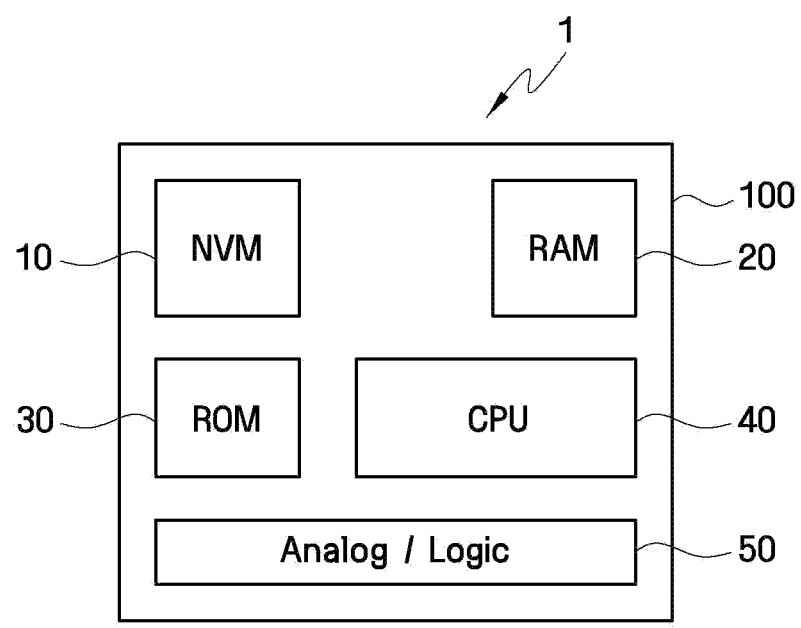
FIG. 1 is a schematic diagram of a semiconductor device fabricated according to the inventive concept.

A semiconductor device and a method of fabricating the same will now be described with reference to FIGS. 1 to 12. In the drawings, the thickness of layers and regions may be exaggerated for clarity.

Referring to FIG. 1, one example of an embodiment of a semiconductor device 1 according to the inventive concept includes a memory block 10, a RAM block 20, a ROM block 30, a central processing unit (CPU) block 40, and a logic block 50. Here, the memory block 10, the RAM block 20, the ROM block 30, the CPU block 40, and the logic block 50 are spaced a predetermined distance apart from each other across a substrate 100.

The memory block 10 is a program embedded block. In order to prevent a program stored therein from being erased even when power to memory block 10 of semiconductor device 1 is turned off, the memory block 10 includes a nonvolatile memory device. The RAM block 20, the ROM block 30, the CPU block 40 and the logic block 50 may include semiconductor devices (not shown) for executing logic operations to process an embedded program of the memory block 10.

Figure 2:
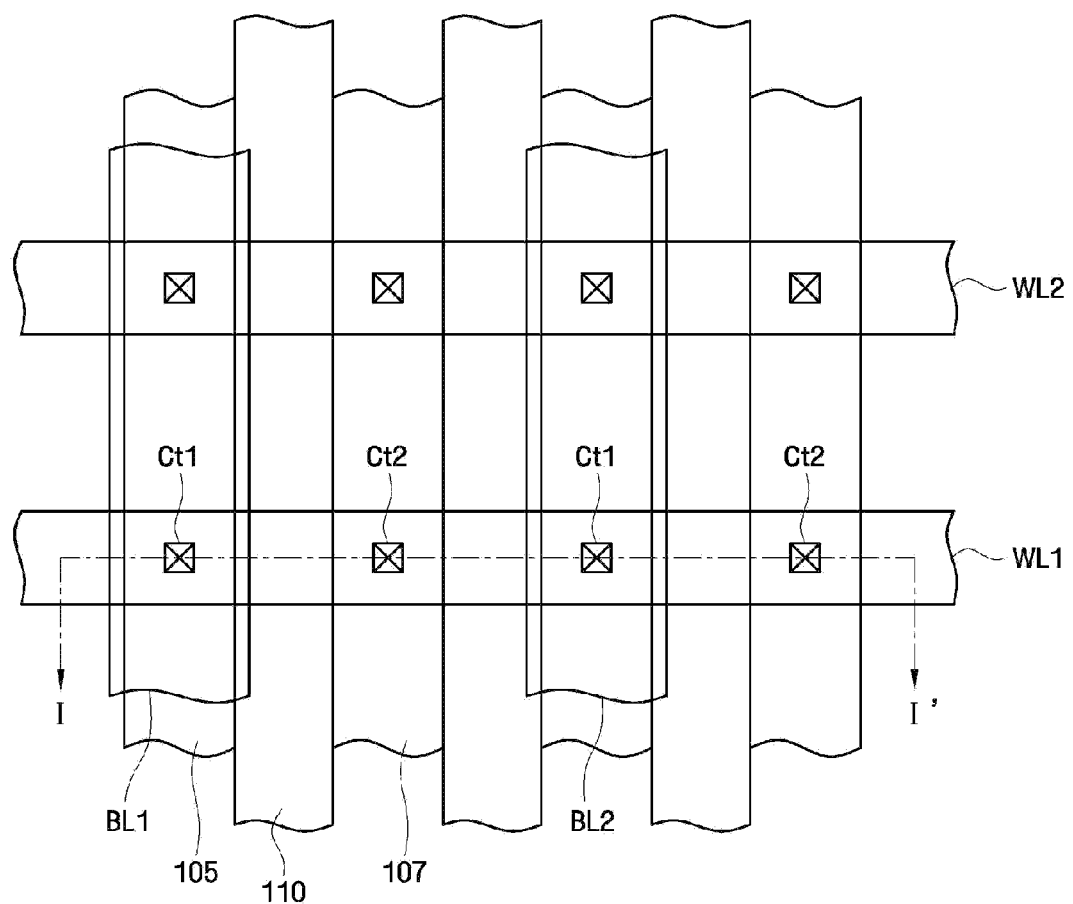
FIG. 2 is a plan view of a memory block of the semiconductor device shown in FIG. 1.
Figure 3:
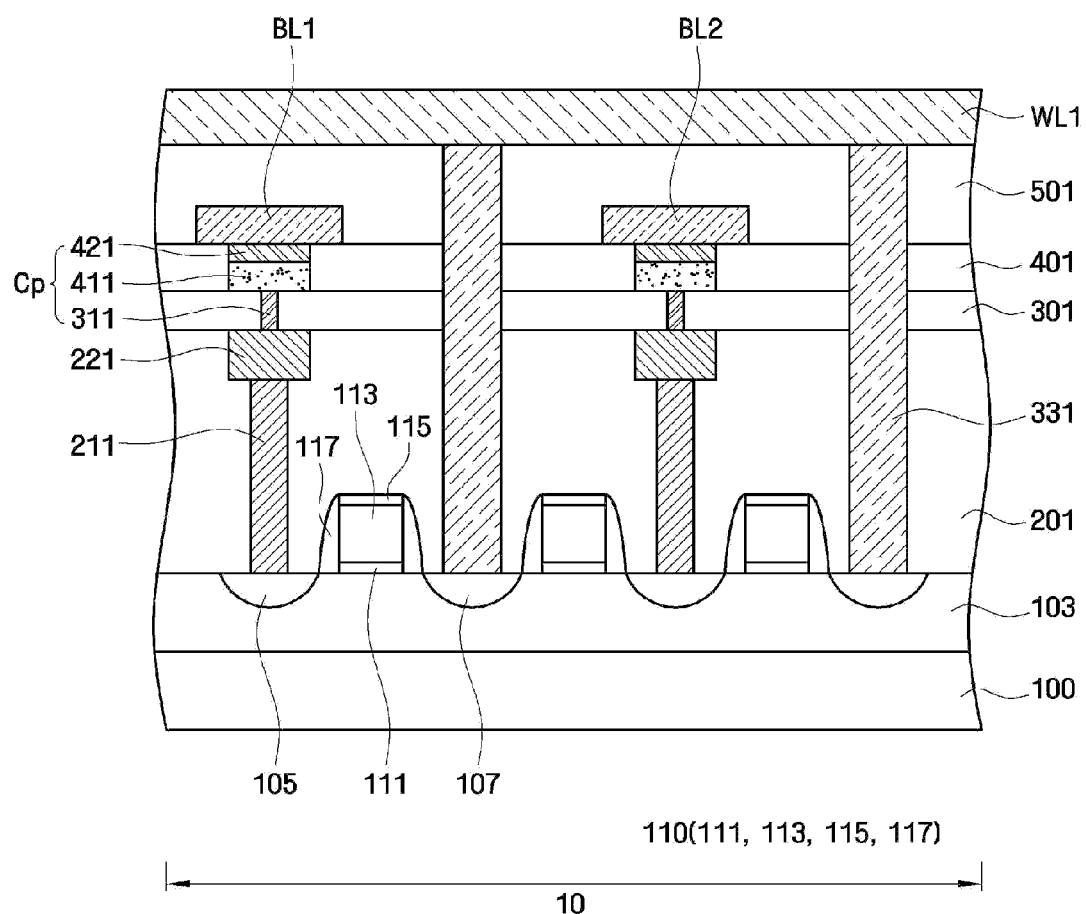
FIG. 3 is a cross-sectional view taken along line I-I' of FIG. 2.

Referring now to FIGS. 2 and 3, the memory block 10 includes a nonvolatile memory device Cp on substrate 100 and bipolar junction transistors (BJTs) 103, 105, and 107 that drive the nonvolatile memory device Cp. In the illustrated example of the present embodiment, the nonvolatile memory device Cp has a first electrode 311, a phase change material pattern 411 and a second electrode 421. That is to say, the nonvolatile memory device Cp is a phase change memory device.

The substrate 100 may be a silicon substrate, a silicon-on-insulator (SOI) substrate, a gallium arsenide (GaAs) layer, a silicon-germanium (SiGe) layer, or the like. Also, the substrate 100 may be of a first conductivity type or a second conductivity type. That is, the substrate 100 may have a p-type or n-type conductivity. For convenience, the substrate 100 will be described in the following as having a p-type conductivity.

A well region 103 is formed at an upper portion of the substrate 100. The well region 103 has a conductivity type different from that of the remainder of the substrate 100. In this example in which the substrate 100 has a p-type conductivity, the well region 103 has an n-type conductivity. If the well region 103 has an n-type conductivity, it may be formed by doping impurities of an element in Group 5 in the periodic table of elements into a predetermined region of the substrate 100.

The memory block 10 also includes a dummy gate pattern 110 extending in a first direction on the well region 103. The dummy gate pattern 110 may include a gate insulation layer pattern 111, a gate pattern 113, a silicide pattern 115 and a spacer 117. In this case, the spacer 117 is disposed on opposing side surfaces of the gate insulation layer pattern 111, the gate pattern 113 and silicide pattern 115. Furthermore, the dummy gate pattern 110 is electrically isolated in the memory block 10 so that it does not receive any external electrical signals. That is to say, the dummy gate pattern 110 is electrically isolated from all other electrical components of the semiconductor device 1.

The gate insulation layer pattern 111 may be a thermal oxide layer, a silicon oxide (SiOx) layer, e.g., a flowable oxide (FOX) layer, a torene silazene (TOSZ) layer, an undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, or a high density plasma (HDP) layer. The gate pattern 113 may include poly-Si, poly-SiGe, a metal such as Ta, TaN, TaSiN, TiN, Mo, Ru, Ni, or NiSi, or combinations thereof. The silicide pattern 115 may be metal silicide, such as CoSi, TiSi, NiSi, TaN, TaSiN or TiN, but is not limited thereto. The spacer 117 may include a nitride layer or an oxide layer.

A first region 105 of the first conductivity type is formed to one side of the dummy gate pattern 110 and a second region 107 of the second conductivity type is formed at the other side of the dummy gate pattern 110. The first region 105 may have a p-type conductivity, and the second region 107 may have an n-type conductivity. Accordingly, the substrate may be doped with impurities of an element in Group 3 in the periodic table of elements may to form the first region 105, and with impurities of an element in Group 5 in the periodic table of elements to form the second region 107. In this example, the concentration of impurities of the first region 105 is greater than that of the concentration of impurities in the substrate 100. In addition, the concentration of impurities of the second region 107 is greater than that of impurities of the well region 103.

The well region 103, the first region 105 and the second region 107 form a bipolar junction transistor (BJT). The BJT controls the operation of a nonvolatile memory device Cp.

A first interlayer dielectric layer 201 disposed on the substrate 100 covers the first region 105, the second region 107 and the dummy gate pattern 110. The first interlayer dielectric layer 210 may be a silicon oxide (SiOx) layer, e.g., a flowable oxide (FOX) layer, a torene silazene (TOSZ) layer, an undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, or a high density plasma (HDP) layer.

A contact pattern 211 extends through the first interlayer dielectric layer 201 to the first region 105 so as to be electrically connected to the first region 105. The contact pattern 211 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

A conductive pattern 221 is disposed in the first interlayer dielectric layer 201 on the contact pattern 211. Thus, the conductive pattern 221 is electrically connected to the first region 105 through the contact pattern 211. Also, the conductive pattern 221 is wider than the contact pattern 211. The conductive pattern 221 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

A second interlayer dielectric layer 301 is disposed on the first interlayer dielectric layer 201. The second interlayer dielectric layer 301 may be a silicon oxide (SiOx) layer, e.g., a flowable oxide (FOX) layer, a torene silazene (TOSZ) layer, an undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, a high density plasma (HDP) layer, or the like.

A first electrode 311 of the nonvolatile memory device Cp extends through the second interlayer dielectric layer 301. The first electrode 311 electrically contacts the conductive pattern 221. Accordingly, the first electrode 311 is electrically connected to the first region 105. Also, the first electrode 311 may be narrower than the conductive pattern 221. The first electrode 311 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

A third interlayer dielectric layer 401 is disposed on the second interlayer dielectric layer 301. The third interlayer dielectric layer 401 may be used as a mold layer as will be clear from the description that follows, especially with respect to the method of fabricating the semiconductor device. The third interlayer dielectric layer 401 may be a thermal oxide layer, a silicon oxide (SiOx), e.g., a flowable oxide (FOX) layer, a torene silazene (TOSZ) layer, an undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, or a high density plasma (HDP) layer, or the like.

Phase change material pattern 411 of the nonvolatile memory device Cp is embedded in the third interlayer dielectric layer 401. The phase change material pattern 411 contacts the first electrode 311. The most typically used phase-change materials are GeSbTe, GeBiTe, or GeSbTe doped with carbon (C) or nitrogen (N). However, the phase change material pattern 411 may include a binary (two-element) compound such as GaSb, InSb, InSe, SbTe, or GeTe, a ternary (three-element) compound such as GeSbTe, GaSeTe, InSbTe, $SnSb_2Te_4$, or InSbGe, or a quaternary (four-element) compound such as AgInSbTe, (GeSn) SbTe, GeSb (SeTe), or $Te_{81}Ge_{15}Sb_2S_2$. The phase change material preferably has an amorphous state resistance value of approximately 1 MΩ or greater. Furthermore, in this embodiment, the first electrode 311 functions as a heater to induce a phase change in the phase change material pattern 411 of the nonvolatile memory device Cp. Accordingly, in the case in which the conductive pattern 221 connected to the first electrode 311 is wider than the first electrode 311, the first electrode 311 offers increased resistance, thereby rapidly causing the phase change material pattern 411 to change phase.

A second electrode 421 of the nonvolatile memory device Cp is disposed on the phase change material pattern 411. The second electrode 421 may be formed of the same material as the first electrode 311, but is not limited thereto. That is, the second electrode 421 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

Bit lines BL1 and BL2 extending longitudinally in a first direction, parallel to the dummy gate pattern 110, are disposed on the third interlayer dielectric layer 410, each in contact with a second electrode 421. That is, each bit line BL1 and BL2 is electrically connected to a second electrode 421 of a nonvolatile memory device Cp. The bit lines BL1 and BL2 may comprise aluminum (Al) or tungsten (W).

A fourth interlayer dielectric layer 501 is disposed on the bit lines BL1 and BL2 and the third interlayer dielectric layer 401. The fourth interlayer dielectric layer 501 may be a silicon oxide (SiOx) layer, e.g., a flowable oxide (FOX) layer, a Tone SilaZane (TOSZ) layer, an undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate glass (FSG) layer, or a high density plasma (HDP) layer.

The memory block 10 of the semiconductor device 1 also includes a contact plug 331 extending through the first to fourth interlayer dielectric layers 201, 301, 401, and 501 and electrically connected to the second region 107. The contact plug 331 may be made of, for example, titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium oxynitride (TiON), titanium aluminum oxynitride (TiAlON), tungsten oxynitride (WON) and/or tantalum oxynitride (TaON).

Word lines WL1 and WL2 extending in a second direction, at an angle with respect to the first direction in which the bit lines BL1 and BL2 extend, are disposed on the fourth interlayer dielectric layer 501. Each word line WL1 and WL2 is electrically connected to several of the contact plugs 331. Accordingly, each word line WL1 and WL2 is electrically connected to a second region 107. The word lines WL1 and WL2 may comprise aluminum (Al) or tungsten (W). Also, each word line WL1 and WL2 may extend to the logic block 50 where the word line is electrically connected to a transistor (s) of the logic block 50. In this way, the transistor(s) of the logic block 50 may control a program embedded in the memory block 20.

Next, a method of fabricating a semiconductor device according the inventive concept will be described with reference to FIGS. 4 to 12.

Figure 4:
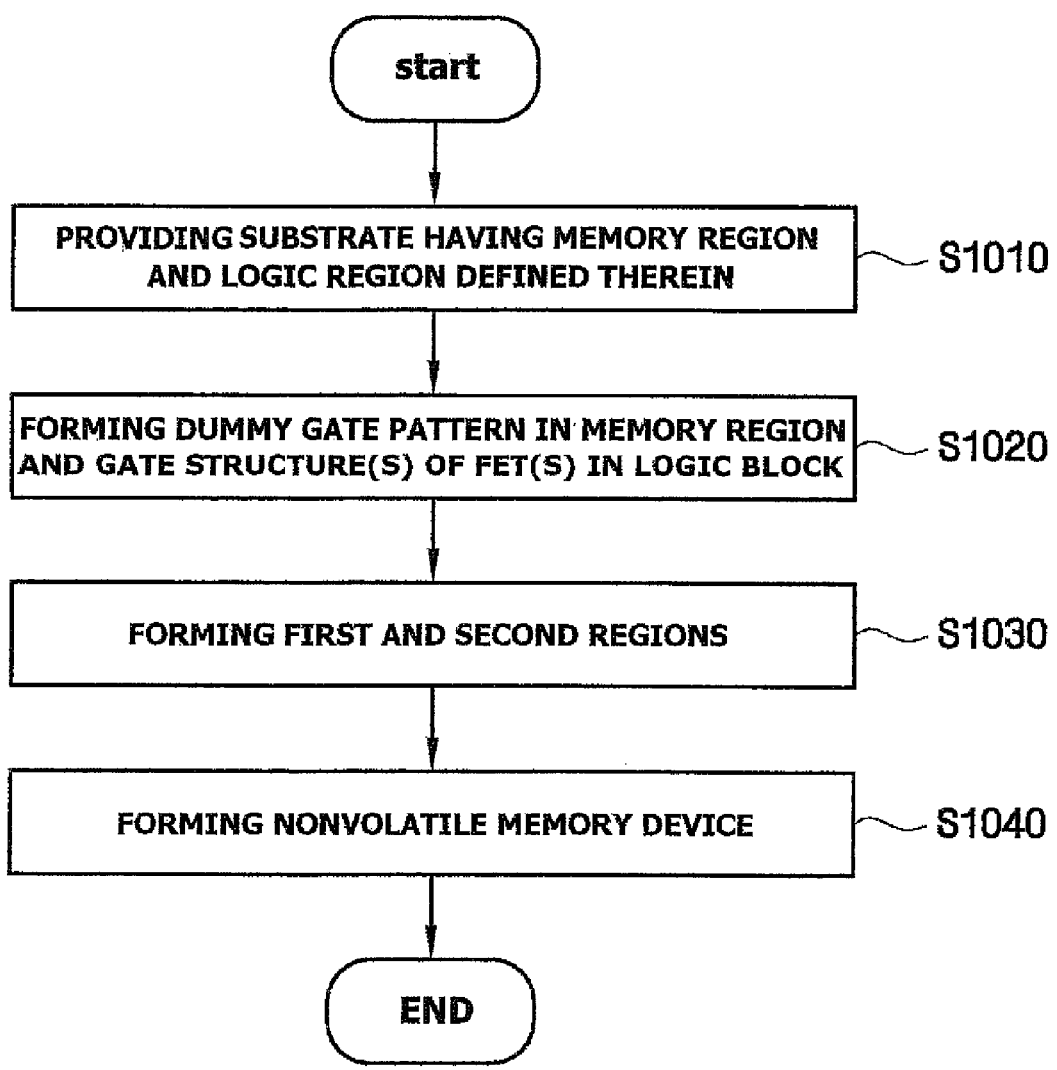
FIG. 4 is a flow chart illustrating a method of fabricating a semiconductor device, of the type shown in FIG. 1, according to the inventive concept.
Figure 5A:
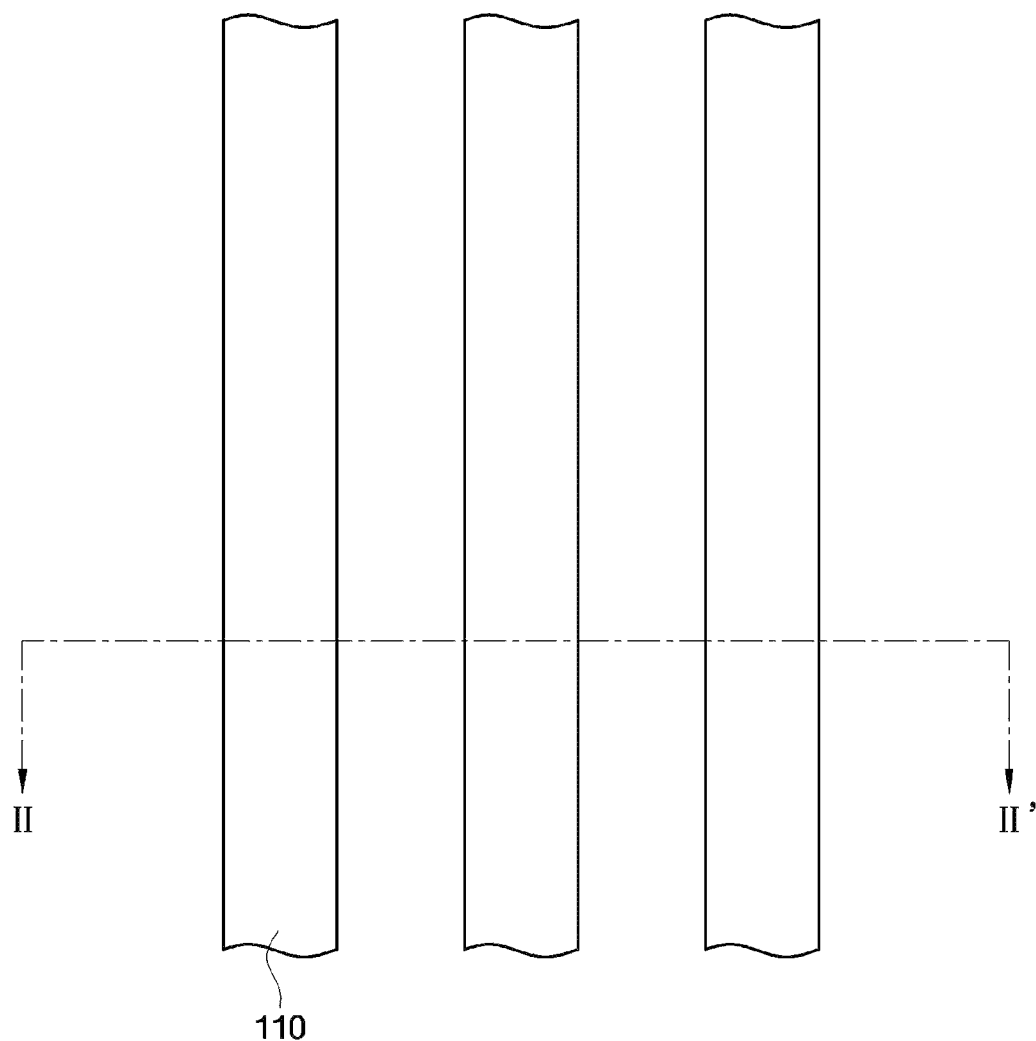
FIG. 5A is a plan view illustrating an intermediate process step in the method of fabricating a semiconductor device according the inventive concept.
Figure 5B:
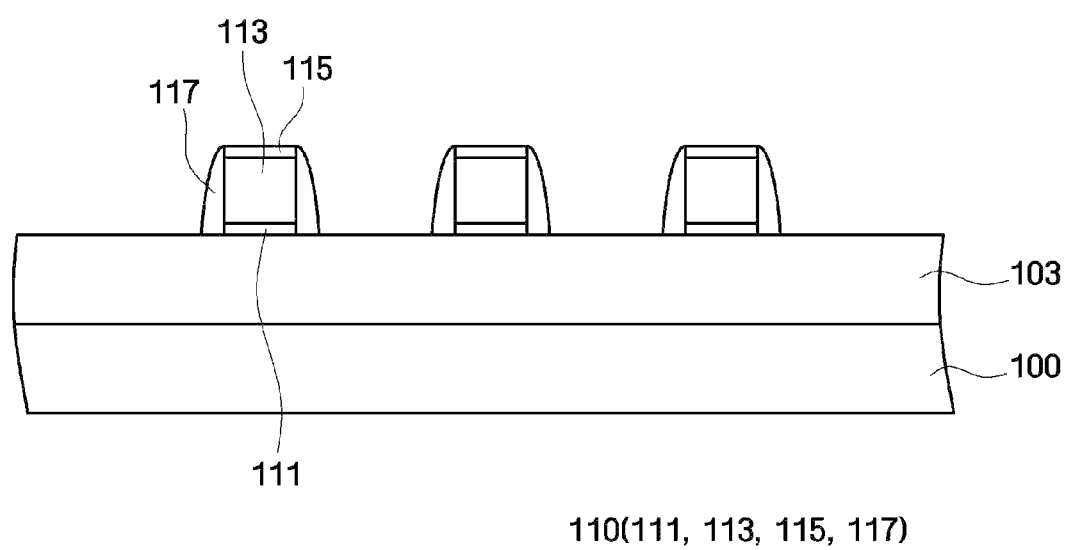
FIG. 5B is a cross-sectional view taken along line II-IF of FIG. 5A.

Referring first to FIGS. 4, 5A and 5B, a substrate 100 of a p-type conductivity, having the memory block 10, the RAM block 20, the ROM block 30, the CPU block 40, and the logic block 50 defined therein, is provided (S1010). Next, impurities of a Group-5 element, such as nitrogen (N), are doped into the memory block 10 of the substrate 100, thereby forming a well region 103.

Next, a dummy gate pattern 110 is formed on the well region 103 (S1020). The dummy gate pattern 110 may be formed as a line pattern extending longitudinally in a first direction. To form the dummy gate pattern 110, a gate insulation layer pattern forming layer of, for example, silicon oxide (SiOx), is formed on the well region 103 by a chemical vapor deposition (CVD) process. Subsequently, a gate pattern forming layer of, for example, polysilicon (p-Si), is formed on the gate insulation layer pattern forming layer using a chemical vapor deposition (CVD) process. Next, a silicide pattern forming of, for example, titanium nitride (TiN), is formed on the gate pattern forming layer using a chemical vapor deposition (CVD) process. Then the gate insulation layer pattern forming layer, the gate pattern forming layer and the silicide pattern forming layer are etched to form a gate insulation layer pattern 111, a gate pattern 113 and a silicide pattern 115, respectively.

Next, a spacer forming material layer is formed over the gate insulation layer pattern 111, the gate pattern 113 and the silicide pattern 115. The spacer forming layer may be formed of, for example, silicon oxide (SiOx), using a chemical vapor deposition (CVD) process. Subsequently, the spacer forming material layer is etched back to form a spacer 117 on opposing lateral surfaces of the gate insulation layer pattern 111, the gate pattern 113 and the silicide pattern 115.

Meanwhile, semiconductor elements (not shown) are formed in the RAM block 20, the ROM block 30, the CPU block 40 and the logic block 50. The semiconductor elements may be transistors each having a gate electrode structure, i.e., may be field effect transistors (FETs). The dummy gate pattern 110 may be formed at the same time as the gate electrode structures of the semiconductor elements because the dummy gate pattern has the same form as a gate electrode structure. Accordingly, a separate mask is not required to form the dummy gate pattern 110.

Referring to FIGS. 4 and 6A to 6H, a first region 105 and a second region 107 are formed (S1030) on the resultant structures (structures shown in FIGS. 5A and 5B). More specifically, the first region 105 is formed at one side of the dummy gate pattern 110 and the second region 107 is formed at the other side of the dummy gate pattern 110.

To form the first region 105, a first photoresist pattern 811 (FIG. 6C) having a first blocking portion 815 and a first opening 813 is first formed on substrate 100. The first opening 813 exposes one portion of the dummy gate pattern 110 as well as a first region of the well 103 to one side of the dummy gate pattern 110, whereas the first blocking portion 815 covers another portion of the dummy gate pattern 110 as well as a second region of the well 103 located on other side of the dummy gate pattern 110. The first photoresist pattern 811 is formed as follows.

Referring to FIG. 6B, a photoresist layer 810 is formed on the substrate 100, and a mask 900 having an opening 902 and a blocking portion 901 is positioned over the photoresist layer 810. In this example, the photoresist layer 810 is of a positive type. The opening 902 is aligned with a first region of the photoresist layer 810 covering the region of the well 103 to one side of the dummy gate pattern 110 and one portion of the dummy gate pattern 110. The blocking portion 901 is located over a second region of the photoresist layer 810 covering the region of the well 103 to other side of the dummy gate pattern 110 and the other portion of the dummy gate pattern 110. If the photoresist layer 810 is of a negative type, the blocking portion is located over the first region of the photoresist layer 810 and the opening 902 is aligned with the second region of the photoresist layer 810.

Figure 6A:
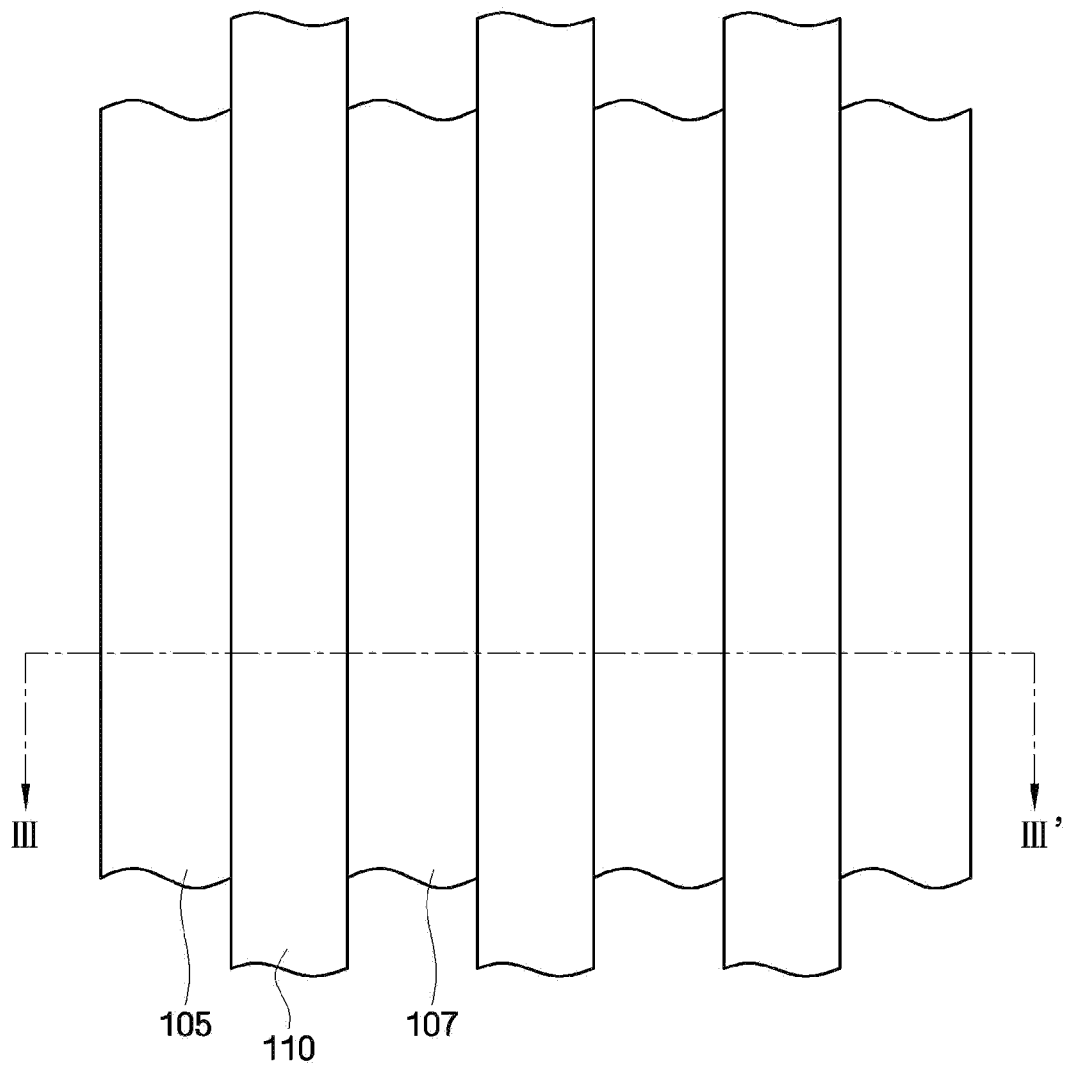
FIG. 6A is another plan view illustrating an intermediate process step in the method of fabricating a semiconductor device according the inventive concept.
Figure 6C:
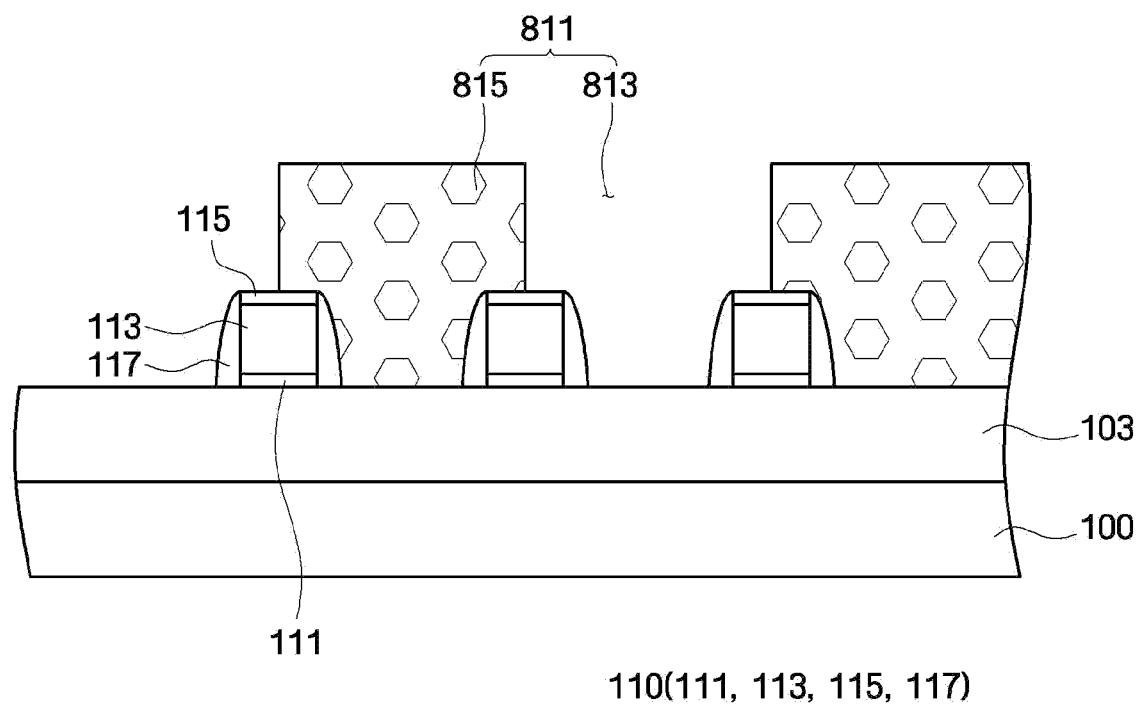

Referring to FIG. 6C, the photoresist layer 810 is exposed to light and developed to form the first opening 813 and first blocking portion 815.

Figure 6D:
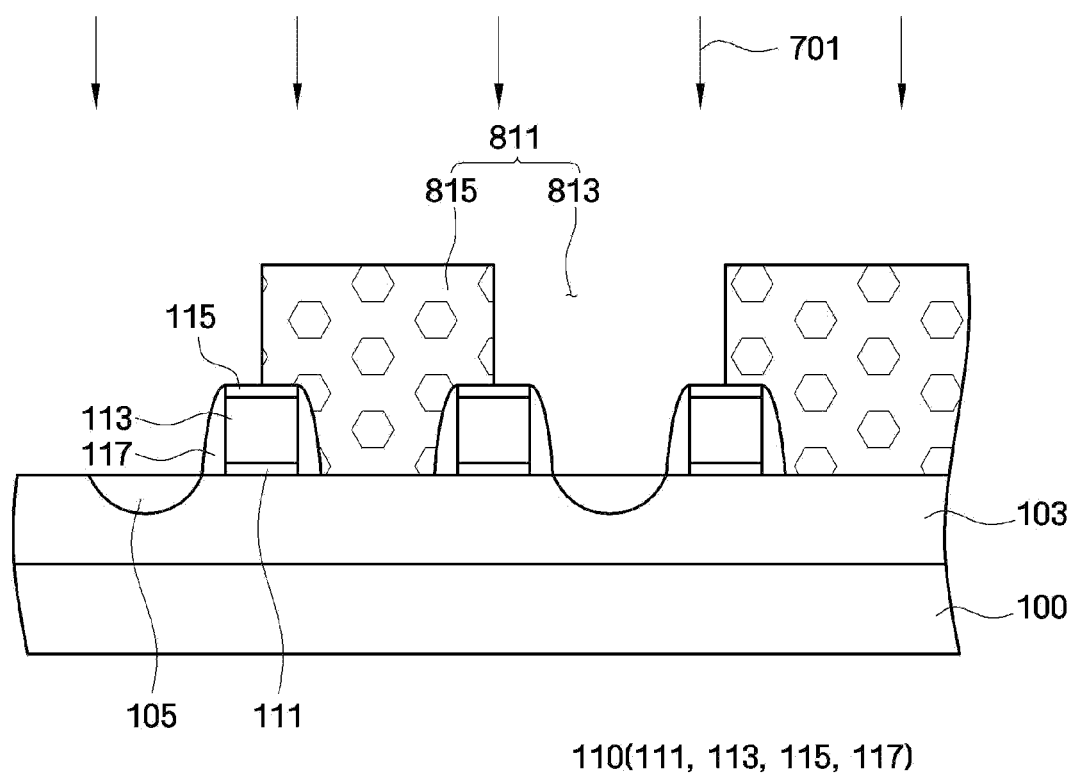

Referring to FIG. 6D, impurities 701 of a first conductivity type are implanted into the region of well 103 exposed by the first opening 813 of the first photoresist pattern 811, thereby forming the first region 105. For example, boron (B) ions are implanted to form p-type first region 105. In this example, the impurities are implanted at a greater concentration than that of the concentration of impurities in the substrate 100 to form the first region 105 as a p$^+$-type region.

Figure 6E:
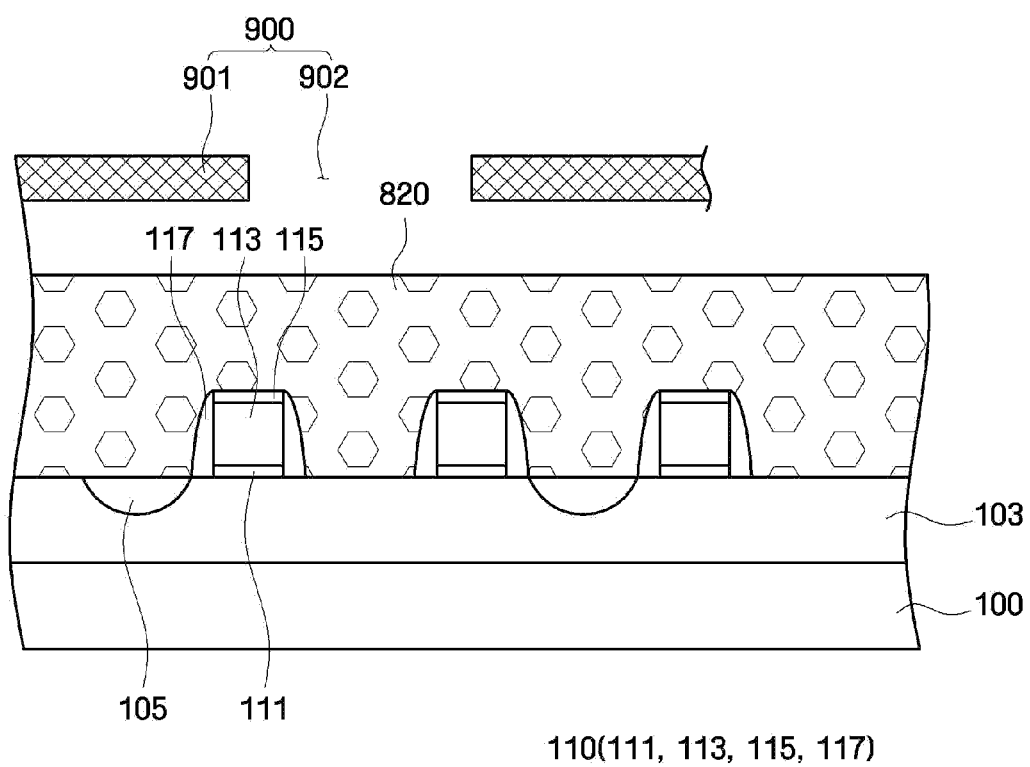
Figure 6F:
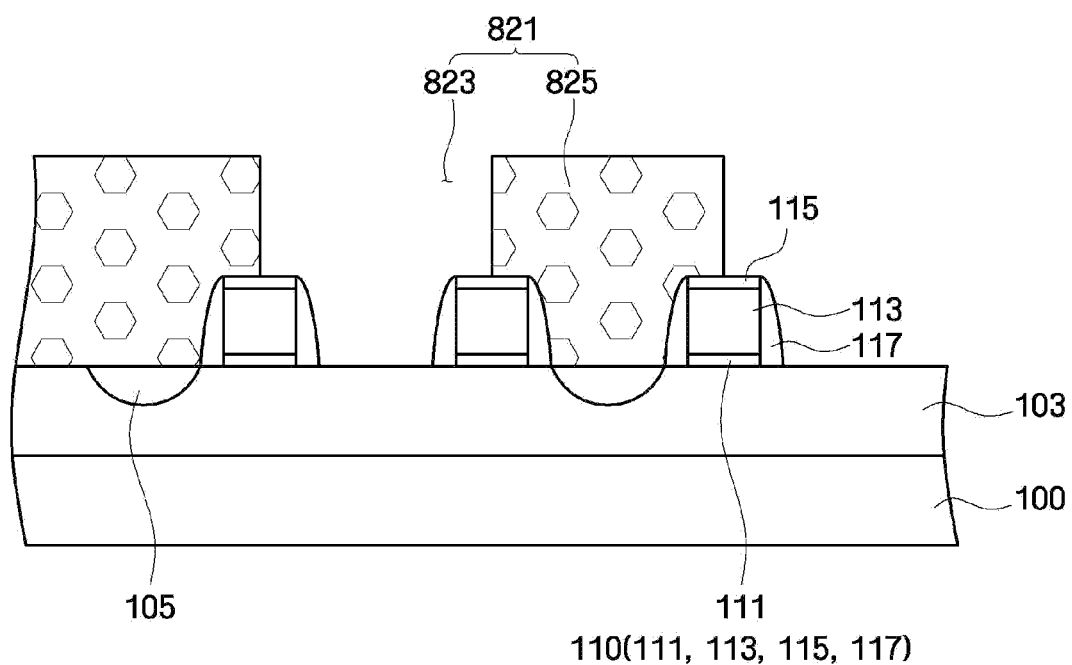

Referring to FIGS. 6E and 6F, in order to form the second region 107, the first photoresist pattern 811 is first removed. Then, a second photoresist pattern 821 is formed on the substrate 100. The second photoresist pattern 821 includes a second blocking portion 825 covering the first region of the well 103 located to one side of the dummy gate pattern and one portion of the dummy gate pattern 110, and a second opening 823 exposing the second region of the well 103 located to the other side of the dummy gate pattern 110 as well the other portion of the dummy gate pattern 110. The second photoresist pattern 821 is formed as follows.

A photoresist layer 820 (FIG. 6E) is formed on the substrate 100, and a mask 900 having an opening 902 and a blocking portion 901 is positioned over the photoresist layer 820. In the illustrate example, the photoresist layer 820 is of a positive type. Thus, the opening 902 is aligned with a region of the photoresist layer 820 covering the second region of the well 103 and a portion of the dummy gate pattern 110. The blocking portion 901 is located over a region of the photoresist layer 820 covering the first region of the well 103 and the other portion of the dummy gate pattern 110. If the photoresist layer 810 is of a negative type, the opening is aligned with the region of the photoresist layer 810 covering the first region of the well 103 and one portion of the dummy gate pattern 110, and the blocking portion is located over the region of the photoresist layer 810 covering the second region of the well 103 and the other portion of the dummy gate pattern 110.

Next, the photoresist layer 820 is exposed to light and developed to form opening 823 and blocking portion 825.

Figure 6G:
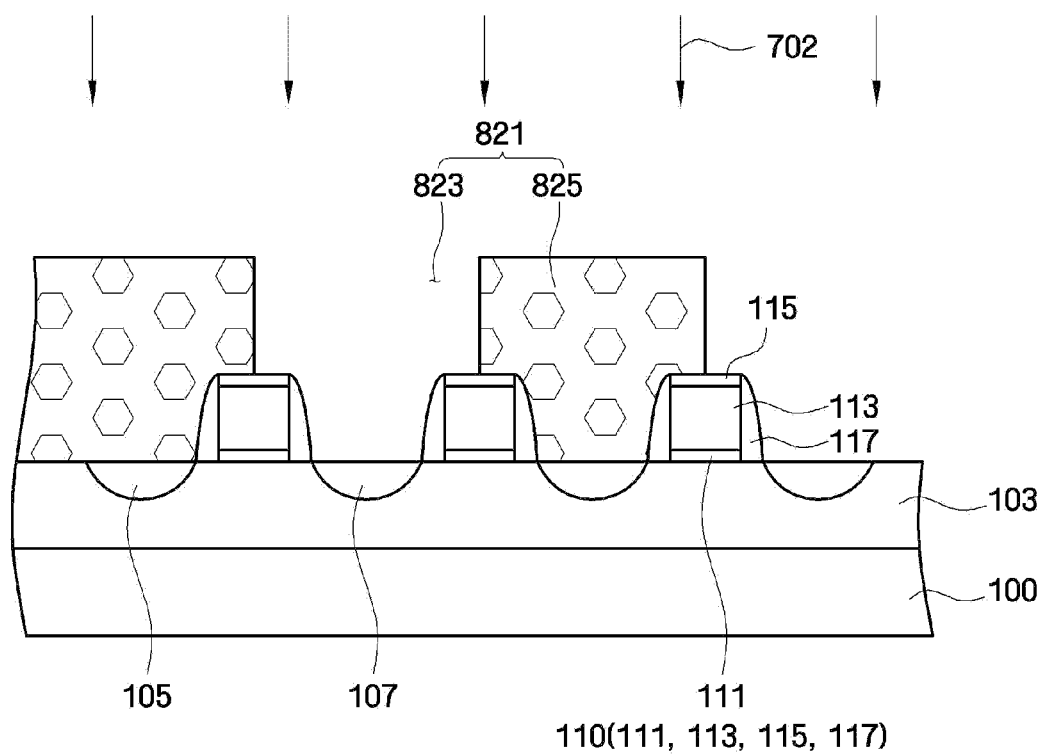

Referring to FIG. 6G, impurities 702 of the second conductivity type are implanted into the (second) region of the well 103 exposed by the second opening 823 of the second photoresist pattern 821, thereby forming the second region 107. For example, nitrogen (N) is implanted to form the n-type second region 107. In this example, the impurities are implanted at a concentration greater than that of impurities of the well region 103 to form the second region 107 as an n'-type region.

Figure 6H:
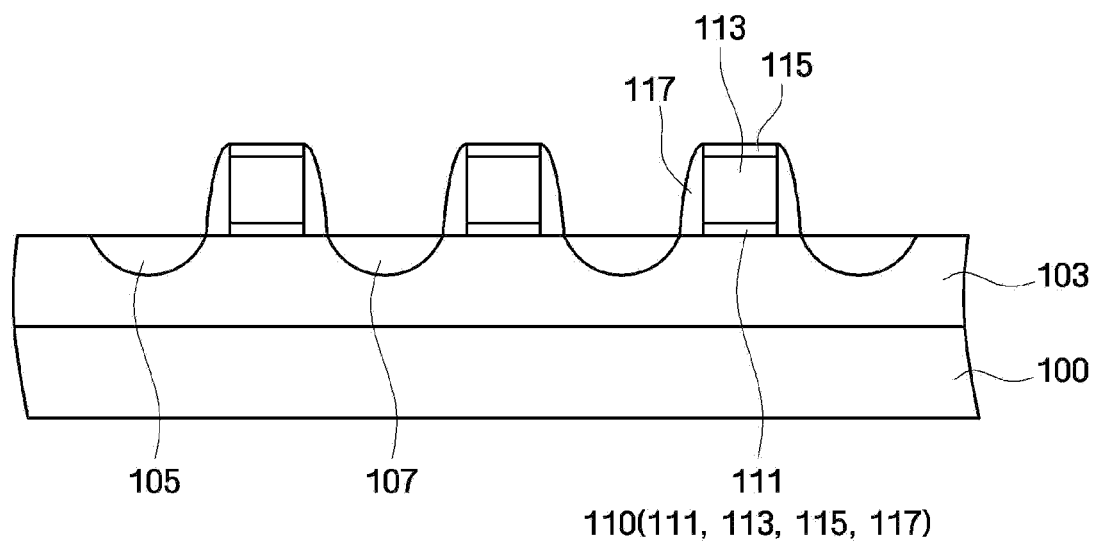

Referring to FIG. 6H, the second photoresist pattern 821 is removed. Accordingly, the first region 105 and the second region 107 are formed at opposite sides, respectively, of the dummy gate pattern 110 on the substrate 100.

According to an aspect of the inventive concept, the dummy gate pattern 110 is formed before the first region 105 and the second region 107, and is used as part of a mask for forming the first region 105 and for forming the second region 107. Therefore, a relatively wide process margin is realized, preventing misalignment from occurring in the process in which impurities are implanted into the substrate to form the access device for the Cp.

Meanwhile, as described above, semiconductor elements are formed in blocks 20, 30, 40, and 50, of the semiconductor device 1. Some of semiconductor elements are vulnerable to high temperatures. Accordingly, it is preferable to avoid high temperature processes in the fabricating the semiconductor device 1. According to another aspect of the inventive concept, the access device for controlling the operation of the nonvolatile memory device Cp is a BJT and not a diode. Diodes, if used as access devices, would be formed using a selective epitaxial growth (SEG) process which is generally carried out at high temperature. Thus, embodiments of the semiconductor device 1 can be fabricated according to the inventive concept without adversely affecting characteristics of semiconductor elements formed in any region of the semiconductor device 1, such as the logic block 50, outside the memory block 10.

Figure 7:
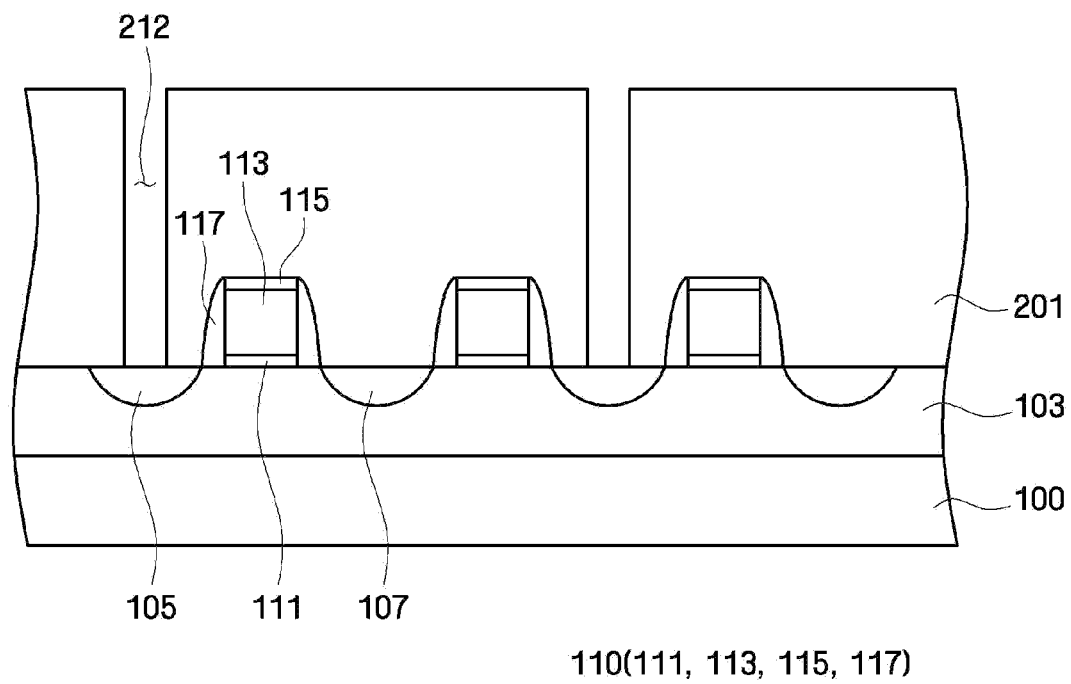

Referring now to FIG. 7, a first interlayer dielectric layer 201 is formed on the substrate 100 over the first region 105, the second region 107 and the dummy gate pattern 110. The first interlayer dielectric layer 201 may be formed of, for example, silicon oxide (SiOx), using a chemical vapor deposition (CVD) process. Then a first contact hole 212 is formed through the first interlayer dielectric layer 201 to expose the first region 105.

Figure 8:
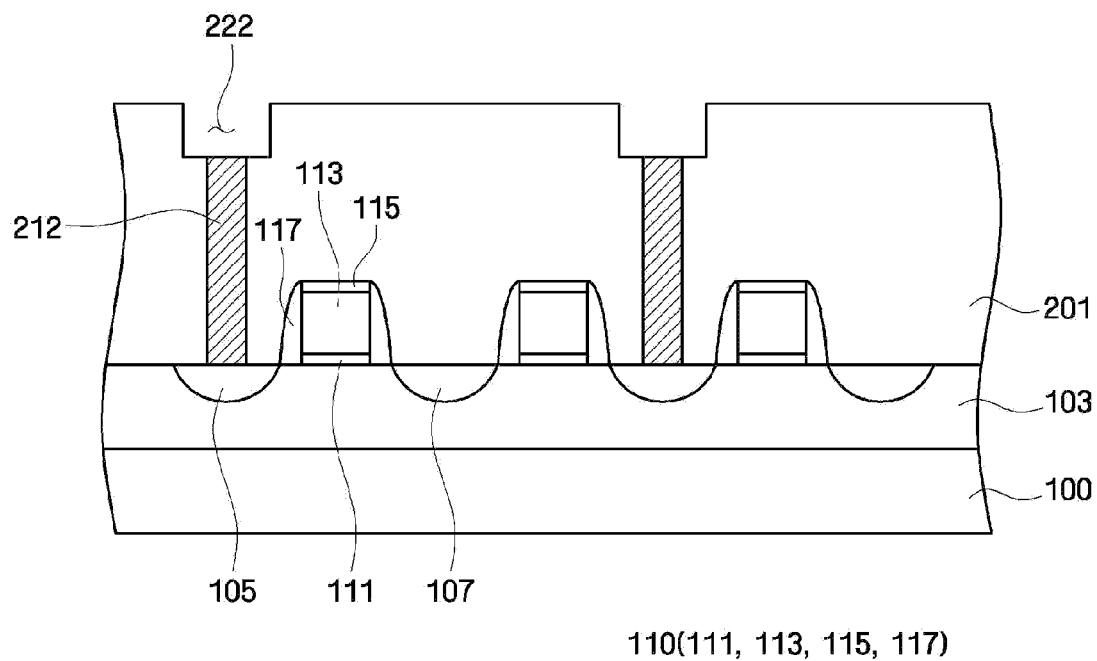

Referring to FIG. 8, contact pattern 211 connected to the first region 105 is formed in the first contact hole 212. The contact pattern 211 may be formed of, for example, titanium nitride (TiN). Subsequently, a portion of the contact pattern 211 is recessed to expose an upper portion of the contact hole 212, and a portion of the first interlayer dielectric layer 201 delimiting the upper portion of the contact hole 212 is etched, thereby forming a recess 222 having a width greater than that of the first contact hole 212.

Figure 9:
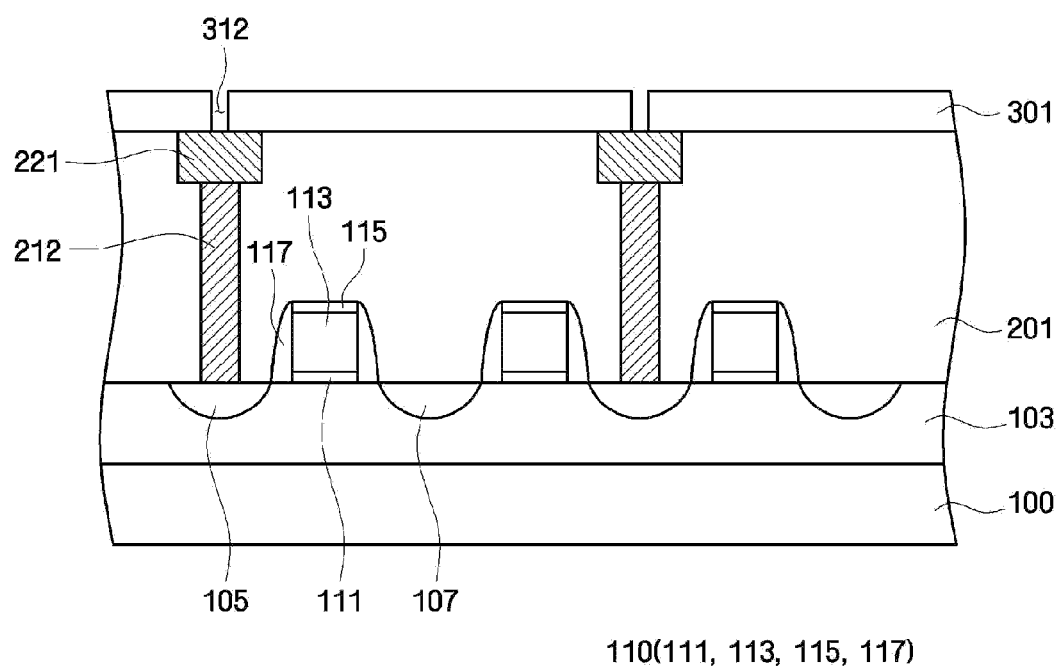

Referring to FIG. 9, a conductive pattern 221 is formed in the recess 222 using, for example, a damascene process. Then, a second interlayer dielectric layer 301 is formed on the first interlayer dielectric layer 201, and a via hole 312 is formed through the second interlayer dielectric layer 301 to expose a portion of the conductive pattern 221.

Figure 10:
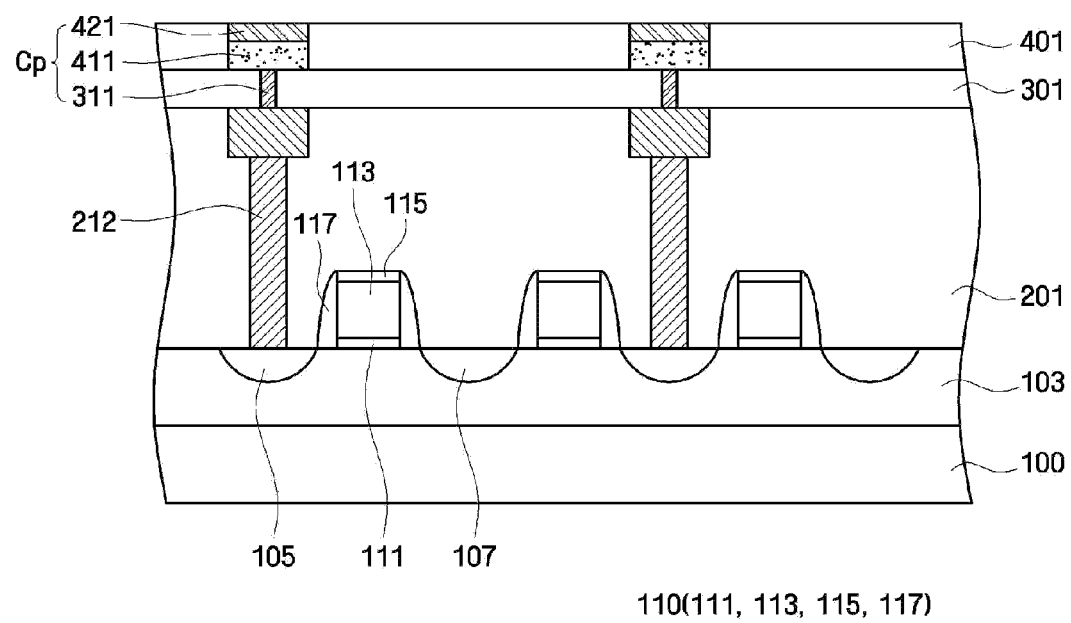

Referring to FIG. 10, the via hole 312 is filled with a conductive material, such as titanium nitride (TiN), to form a first electrode 311. As was described above, the first electrode 311 may be narrower than the conductive pattern 221.

A third interlayer dielectric layer 401 is formed on the second interlayer dielectric layer 301. Next, a hole (not shown) for forming a cell exposing the first electrode 311 is formed. Next, a phase change material pattern 411 is formed in the cell forming hole. The phase change material pattern 411 may be formed of, for example, GeSbTe, using chemical vapor deposition (CVD), atomic layer deposition (ALD), physical vapor deposition (PVD), or a like process. A second electrode 421 is formed on the phase change material pattern 411. Accordingly, a nonvolatile memory device Cp is formed in the memory block 10 (S1040).

Figure 11A:
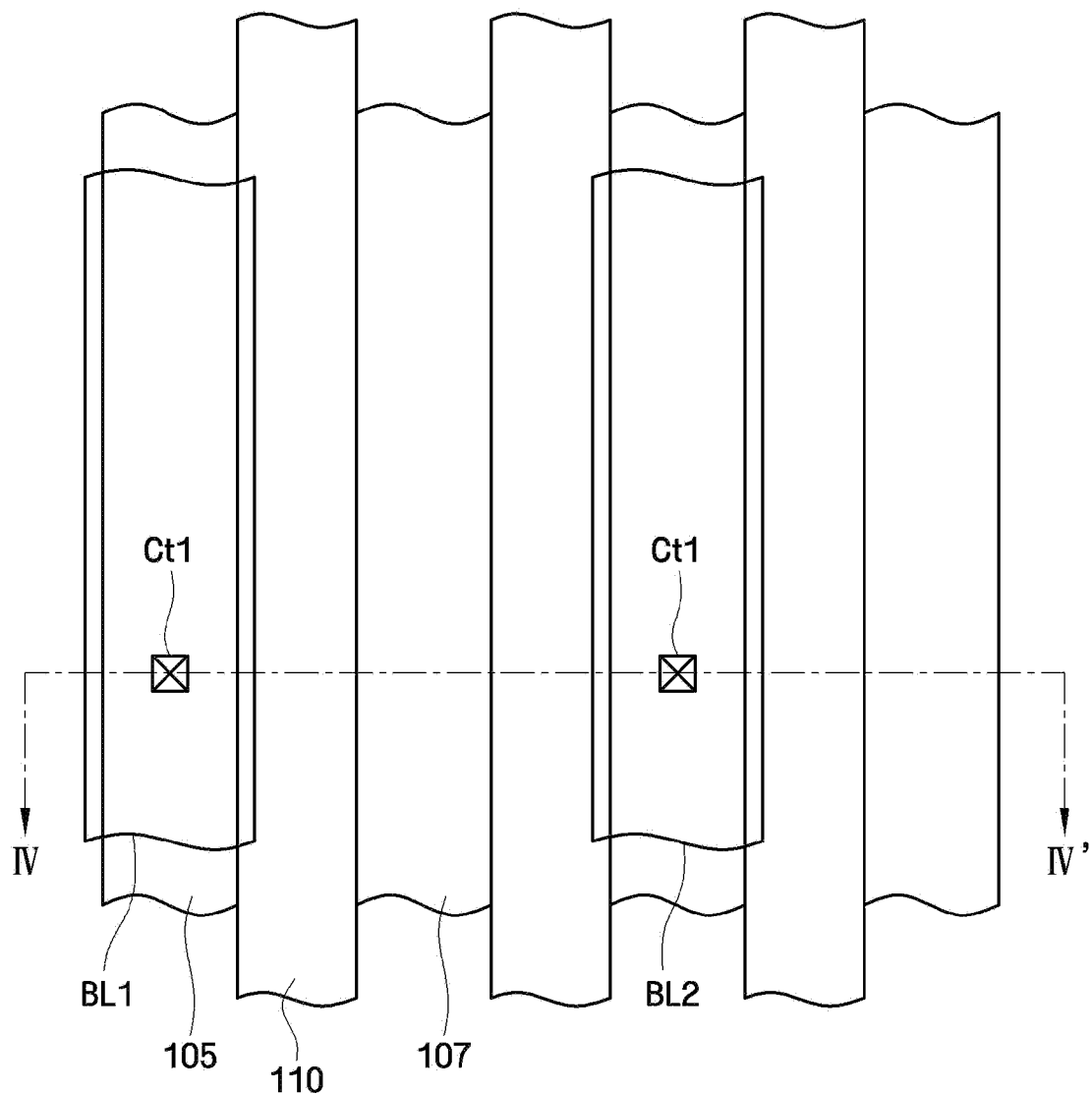
FIG. 11A is still another plan view illustrating an intermediate process step in the method of fabricating a semiconductor device according the inventive concept.
Figure 11B:
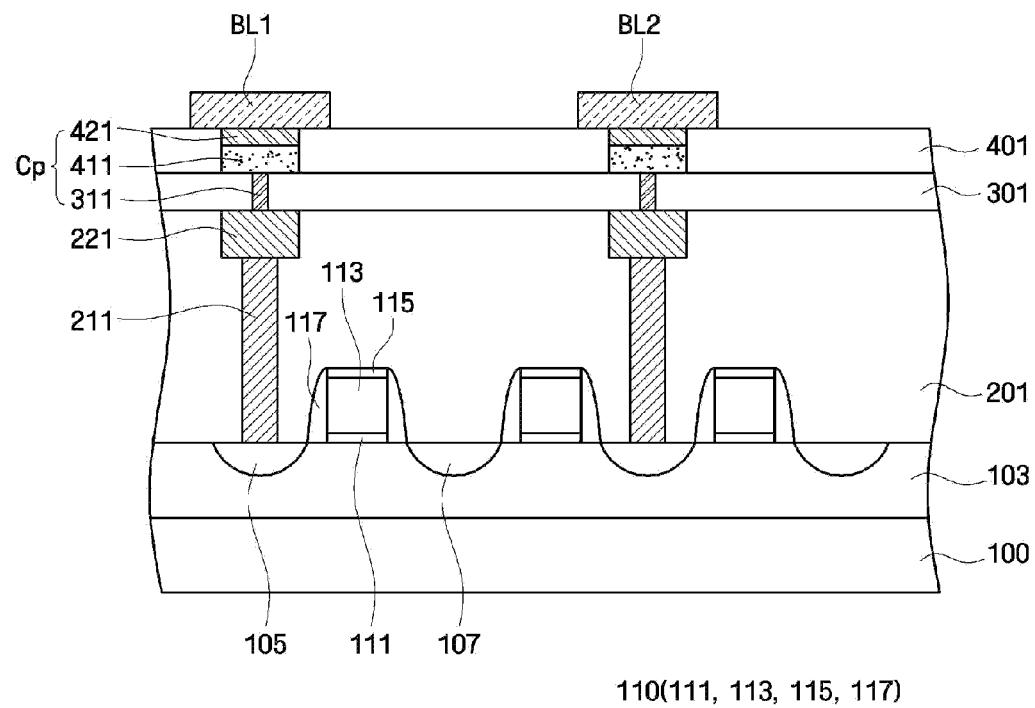
FIG. 11B is a cross-sectional view taken along line IV-IV' of FIG. 11A.

Referring to FIGS. 11A and 11B, bit lines BL1 and BL2 extending in a first direction parallel to the dummy gate pattern 110 are formed on the third interlayer dielectric layer 401. In the illustrated example, each bit line BL1 and BL2 is electrically connected (ct1) to a first region 105 by a nonvolatile memory device Cp, conductive pattern 221, and contact pattern 211.

Figure 12:
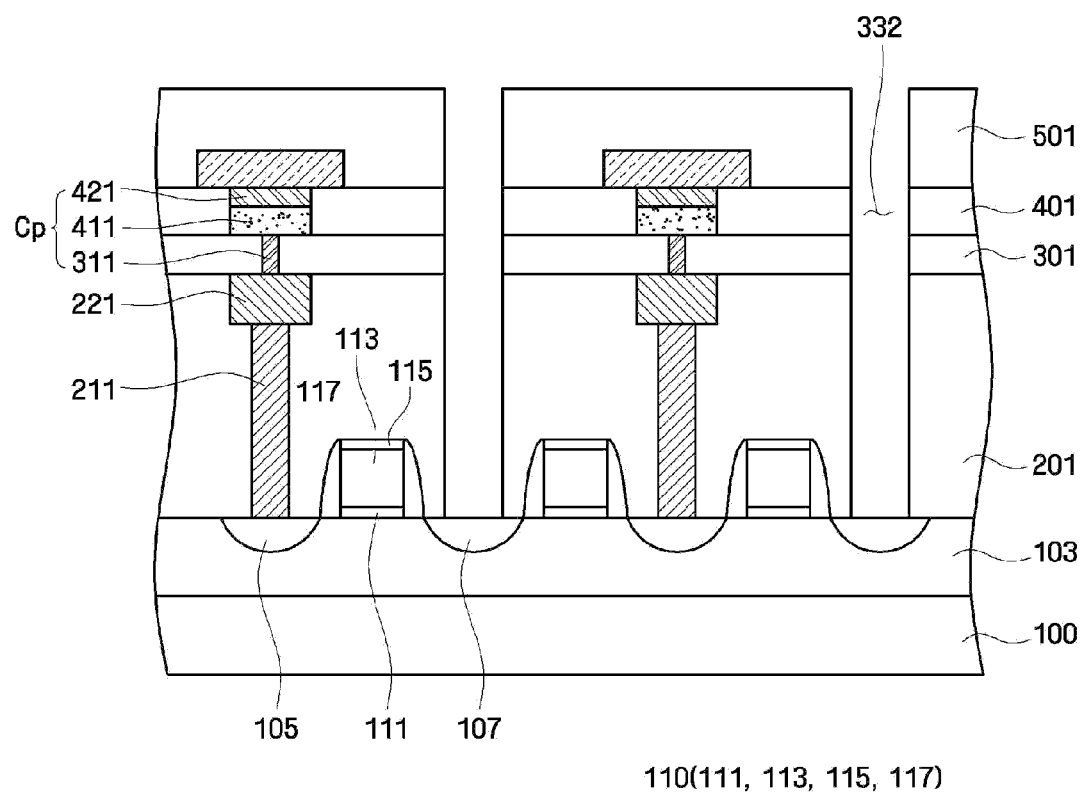
FIG. 12 is another cross-sectional view illustrating an intermediate process step in the method of fabricating a semiconductor device according the inventive concept.

Referring to FIG. 12, a fourth interlayer dielectric layer 501 is formed on the third interlayer dielectric layer 401 over the bit lines BL1 and BL2. Next, a second contact hole 332 is formed through the first to fourth interlayer dielectric layers 201, 301, 401, and 501, to thereby expose the second region 107. Referring to FIGS. 2 and 3, the second contact hole 332 is filled with conductive material, for example, titanium nitride (TiN), to form a contact plug 331.

Next, word lines WL1 and WL2 extending longitudinally in a second direction (intersecting the bit lines BL1 and BL2 when viewed in plan) are formed on the fourth interlayer dielectric layer 501 (refer back to FIG. 3). The word lines WL1 and WL2 are formed to be electrically connected to a contact plug 331. Accordingly, each word line WL1 and WL2 is electrically connected to a second region 107 (ct2 in FIG. 2). The word lines WL1 and WL2 may be formed of, for example, aluminum (Al) or tungsten (W).

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of fabricating a semiconductor device, comprising:
   providing a substrate having a memory block and a logic block;
   forming a dummy gate pattern on the memory block;
   subsequently forming a first region of a first conductivity type at one side of the dummy gate pattern and a second region of a second conductivity type at the other region of the dummy gate pattern;
   forming an interlayer dielectric layer covering the dummy gate on the substrate;
   forming an opening extending through the interlayer dielectric layer and to the first region such that the opening exposes the first region;
   forming an electrically conductive contact pattern within the opening in the interlayer dielectric layer as electrically connected to the first region; and
   forming a nonvolatile memory device, capable of assuming different logic states, on and electrically connected to the contact pattern so as to be electrically connected to the first region via the contact pattern.

2. The method of claim 1, wherein the forming of the dummy gate pattern comprises:
   forming a gate insulation layer pattern on the substrate;
   forming a gate pattern on the gate insulation layer pattern;
   forming a silicide pattern on the gate pattern; and
   forming a spacer on lateral surfaces of the insulating layer pattern, the gate pattern and the silicide pattern.

3. The method of claim 2, further comprising forming a gate electrode structure of a transistor in the logic block simultaneously with the forming of the dummy gate pattern, and wherein the transistor in the logic block is for executing a program embedded in the memory block.

4. The method of claim 1, wherein the forming of the first region comprises forming a photoresist pattern on the substrate, wherein the photoresist pattern exposes at least part of the dummy gate pattern, and implanting impurities into the substrate using the photoresist pattern and the exposed part of the dummy gate pattern as a mask.

5. The method of claim 1, further comprising forming a well region of the first or second conductivity type in the substrate before the dummy gate pattern is formed.

6. The method of claim 1, wherein the forming of the nonvolatile memory device comprises:
   forming a first electrode;
   forming a pattern of phase change material on the first electrode; and
   forming a second electrode on the pattern of phase change material.

7. The method of claim 6, wherein the forming of the first electrode comprises:
   forming another interlayer dielectric layer on the substrate;
   forming a via hole in the another interlayer dielectric layer; and
   filling the via hole with conductive material.

8. The method of claim 7, further comprising forming a conductive pattern electrically connected to the first region via the contact pattern, and wherein the first electrode is formed directly on the conductive pattern and with a width less than a width of the conductive pattern.

9. The method of claim 8, further comprising:
   forming a contact plug extending through the interlayer dielectric layers and into contact with the second region; and
   forming, on the interlayer dielectric, a word line contacting the contact plug.

10. A method of fabricating a semiconductor device, comprising:
    providing a substrate having a memory block and a logic block;
    forming a dummy gate pattern on the memory block;

subsequently forming a first region of a first conductivity type at one side of the dummy gate pattern and a second region of a second conductivity type at the other side of the dummy gate pattern;

forming a first interlayer dielectric layer covering the dummy gate pattern, the first region and the second region;

forming a first electrode in the first interlayer dielectric layer as electrically connected to the first region;

forming a pattern of phase change material on and in contact with the first electrode; and forming a second electrode on the pattern of phase change material.

11. The method of claim 10, wherein the forming of the dummy gate pattern comprises:

forming a gate insulation layer pattern on the substrate;
forming a gate pattern on the gate insulation layer pattern;
forming a silicide pattern on the gate pattern; and
forming a spacer on lateral surfaces of the insulating layer pattern, the gate pattern and the silicide pattern.

12. The method of claim 11, further comprising forming a gate electrode structure of transistor in the logic block simultaneously with the forming of the dummy gate pattern, and wherein the transistor in the logic block is for executing a program embedded in the memory block.

13. The method of claim 12, wherein the forming of the first region comprises forming a first photoresist pattern on the substrate, wherein the first photoresist pattern exposes at least part of the dummy gate pattern, and implanting impurities into the substrate using the first photoresist pattern and the exposed part of the dummy gate pattern as a mask.

14. The method of claim 13, wherein the forming of the second region comprises forming a second photoresist pattern on the substrate, wherein the second photoresist pattern exposes at least part of the dummy gate pattern, and implanting impurities into the substrate using the second photoresist pattern and the part of the dummy gate pattern exposed by the second photoresist pattern as a mask.

15. The method of claim 10, further comprising forming a well region of the first or second conductivity type in the substrate before the dummy gate pattern is formed.

16. The method of claim 10, further comprising:

forming another interlayer dielectric layer on the first interlayer dielectric layer;

forming a contact hole in the interlayer dielectric layers and which exposes the second region;

forming a contact plug filling the contact hole; and forming, on the another interlayer dielectric layer, a word line contacting the contact plug.

17. The method of claim 10, wherein the pattern of phase change material and the first electrode are formed such that a width of the first electrode is less than a width of the pattern of phase change material.

18. The method of claim 17, further comprising forming a conductive pattern electrically connected to the first region, and wherein the first electrode is formed directly on the conductive pattern and with a width less than a width of the conductive pattern.

19. A method of fabricating a semiconductor device, comprising:

forming a dummy gate pattern on a substrate, wherein the dummy gate pattern has the form of a gate electrode structure of a field effect transistor (FET) but is electrically isolated from any other electrical component in the semiconductor device;

forming a bipolar junction transistor (BJT), wherein the forming of the BJT comprises, after the dummy gate pattern has been formed, forming a first region of a first conductivity type at one side of the dummy gate pattern and a second region of a second conductivity type at the other region of the dummy gate pattern; and forming a memory component, comprising phase change material, electrically connected to the first region, such that the BJT controls an operation of the memory component.

20. The method of claim 19, further comprising forming a gate structure of a field effect transistor (FET) simultaneously with the forming of the dummy gate pattern, whereby the formed FET is electrically isolated from dummy gate pattern.

* * * * *